US008652758B2

(12) United States Patent
Kearney et al.

(10) Patent No.: US 8,652,758 B2
(45) Date of Patent: Feb. 18, 2014

(54) LITHOGRAPHIC IMAGING AND PRINTING WITH PRINTING MEMBERS HAVING FUSIBLE POLYMERIC PARTICLES

(75) Inventors: Frederick R. Kearney, Walpole, MA (US); Kevin Ray, Windham, NH (US); Donald Sundberg, Madbury, NH (US); John Tsavalas, Madbury, NH (US)

(73) Assignee: Presstek, Inc., Hudson, NH (US)

( * ) Notice: Subject to any disclaimer, the term of this patent is extended or adjusted under 35 U.S.C. 154(b) by 616 days.

(21) Appl. No.: 12/560,977

(22) Filed: Sep. 16, 2009

(65) Prior Publication Data

US 2011/0065048 A1 Mar. 17, 2011

(51) Int. Cl.

| | |
|---|---|
| ***G03F 7/00*** | (2006.01) |
| ***G03F 7/26*** | (2006.01) |
| ***B41N 1/00*** | (2006.01) |
| ***B41F 7/00*** | (2006.01) |

(52) U.S. Cl.
USPC ........ 430/302; 430/270.1; 430/291; 430/294; 430/300; 430/309; 430/330; 101/450.1; 101/453; 101/463.1

(58) Field of Classification Search
USPC ............... 430/138, 300, 302, 306; 101/450.1, 101/453, 463.1
See application file for complete search history.

(56) References Cited

U.S. PATENT DOCUMENTS

| | | | |
|---|---|---|---|
| 5,981,144 | A | 11/1999 | Damme et al. |
| 6,001,536 | A | 12/1999 | Vermeersch et al. |
| 6,427,595 | B1 | 8/2002 | Van Damme et al. |
| 6,637,334 | B2 | 10/2003 | Akiyama et al. |
| 6,641,976 | B2 | 11/2003 | Vermeersch et al. |
| 7,195,861 | B2 | 3/2007 | Vermeersch et al. |
| 7,316,891 | B2 | 1/2008 | Vander Aa et al. |
| 7,473,516 | B2 | 1/2009 | Vander Aa et al. |
| 2002/0172889 | A1* | 11/2002 | Oohashi ..................... 430/273.1 |
| 2008/0076067 | A1* | 3/2008 | Vander Aa et al. ........... 430/302 |
| 2009/0095184 | A1* | 4/2009 | Vermeersch et al. ...... 101/463.1 |
| 2009/0183647 | A1* | 7/2009 | Jarek ............................. 101/454 |

FOREIGN PATENT DOCUMENTS

| | | | |
|---|---|---|---|
| EP | 0773113 | A1 | 5/1997 |
| EP | 1642714 | A1 | 4/2006 |
| EP | 1767349 | A1 | 3/2007 |
| EP | 1834764 | A1 | 9/2007 |
| EP | 1859935 | A1 | 11/2007 |

* cited by examiner

*Primary Examiner* — Chanceity Robinson
(74) *Attorney, Agent, or Firm* — Bingham McCutchen LLP

(57) ABSTRACT

Embodiments of the present invention involve printing members that utilize a particle-fusion imaging mechanism but avoid susceptibility to handling damage. In particular, printing plates in accordance with the invention may utilize two phases, and these may originate, during manufacture, as two particle systems. Both systems are initially dispersed in a single coating applied as a layer, or in multiple coatings applied as adjacent layers, on a substrate. The second particle system exhibits a glass-transition or thermal coalescing temperature well above room temperature and also above the temperature at which the coating is dried. The coalescing temperature of the first particle system is below the drying temperature. As a result, when the coating is dried, the first particle system coalesces and forms a binder that entrains the second particle system, which has not coalesced. The binder formed by the first particle system is preferably insoluble in aqueous liquids, but is swellable or softened by such liquids, whereas the binder formed by the second particle system is preferably insoluble in and not swellable by aqueous liquids. Aqueous insolubility allows the dried (and ready-to-image) coating to resist handling damage, while swellability facilitates development.

18 Claims, 1 Drawing Sheet

LITHOGRAPHIC IMAGING AND PRINTING WITH PRINTING MEMBERS HAVING FUSIBLE POLYMERIC PARTICLES

BACKGROUND OF THE INVENTION

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. In a wet lithographic system, the non-image areas are hydrophilic, and the necessary ink-repellency is provided by an initial application of a dampening fluid to the plate prior to inking. The dampening fluid prevents ink from adhering to the non-image areas, but does not affect the oleophilic character of the image areas. Ink applied uniformly to the wetted printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

To circumvent the cumbersome photographic development, plate-mounting, and plate-registration operations that typify traditional printing technologies, practitioners have developed electronic alternatives that store the imagewise pattern in digital form and impress the pattern directly onto the plate. Plate-imaging devices amenable to computer control include various forms of lasers.

Current laser-based lithographic systems frequently rely on removal of an energy-absorbing layer from the lithographic plate to create an image. Exposure to laser radiation may, for example, cause ablation—i.e., catastrophic overheating—of the ablated layer in order to facilitate its removal. Because ablation produces airborne debris, ablation-type plates must be designed with imaging byproducts in mind; for example, the plate may be designed so as to trap ablation debris between layers, at least one of which is not removed until after imaging is complete.

Alternatives to ablation-type plates include plates utilizing a less energetic imaging mechanism, such as polymer fusion or coalescence. For example, polymer particles may be dispersed within a water-soluble binder, which holds the particles together; the binder is applied as a coating onto a substrate. The coating also contains a material that absorbs imaging (e.g., infrared or "IR") radiation and converts it to heat, which fuses the particles into a monolithic solid feature. In use, the plate is exposed to imaging radiation in an imagewise fashion, selectively fusing the particles. The unexposed regions of the particle-containing coating are then washed away, typically using a processing solution with mild enough properties to be considered a post-development gum.

Unfortunately, these plates can be difficult to handle and store. The binder's water solubility facilitates post-imaging development, but also imparts sensitivity to fingerprints or handling damage—particularly in wet or humid environments.

SUMMARY OF THE INVENTION

Embodiments of the present invention involve printing members that utilize a particle-fusion imaging mechanism but avoid susceptibility to handling damage characteristic of the prior art. In particular, printing plates in accordance herewith utilize two phases, which may originate, during manufacture, as two particle systems. Both systems are initially dispersed in a single coating applied as a layer, or in multiple coatings applied sequentially as adjacent layers, on a substrate. (For ease of explanation, the ensuing discussion presumes a single layer.) The second particle system exhibits a glass-transition ($T_g$) or thermal coalescing temperature well above room temperature and also above the temperature at which the coating is dried. The coalescing temperature of the first particle system is below the drying temperature. As a result, when the coating is dried, the first particle system coalesces and forms a binder that entrains the second particle system, which has not coalesced. The binder formed by the first particle system is preferably insoluble in aqueous liquids, but is swellable or softened by such liquids. Aqueous insolubility allows the dried (and ready-to-image) coating to resist handling damage, while swellability facilitates development as follows.

The printing plate is exposed in an imagewise fashion to imaging radiation, which heats the entrained particles beyond their coalescence temperature. After cooling, the areas of the printing plate that have received radiation are monolithically solid, water-insoluble, and durable enough to withstand many impressions in a commercial printing environment. Unimaged regions, however, are still swellable, so subjecting the imaged printing plate to an aqueous liquid (and, as necessary, mechanical action) removes both the swellable binder and the entrained particles, exposing the underlying substrate. The substrate and the solidified plate regions exhibit different lithographic affinities, so the result is a lithographic plate image. (If the substrate is hydrophilic and the imaged areas oleophilic, the plate is "negative-working.") The resulting imaged and processed plate is suitable for lithographic printing.

Accordingly, in a first aspect, embodiments of the invention relate to a lithographic printing member that comprises, on a substrate, an imaging layer that itself comprises a first polymer binder—e.g., resulting from prior coalescence of polymer particles—and, dispersed therein, particles coalesceable into a second polymer binder at a thermal coalescing temperature substantially above room temperature. The term "room temperature" means 20-25° C. By "substantially above" is meant at least 55-60° C. above room temperature. The printing member also includes a material that absorbs imaging (e.g., IR) radiation and is heatable thereby to a temperature of at least the thermal coalescing temperature of the particles. In general, the absorptive material (which may be a pigment, such as carbon black, or a dye, such as a cyanine or, phthalocyanine, or a combination thereof) is dispersed within the imaging layer. The first polymer binder is insoluble in but swellable by an aqueous liquid, the second polymer binder is insoluble and not swellable by an aqueous liquid. By "not swellable" is meant no more than 10% swelling by volume.

The first and second polymer binders collectively exhibit a first lithographic affinity (e.g., oleophilicity) for ink or a liquid to which ink will not adhere, and the substrate exhibits a second lithographic affinity (e.g., hydrophilicity) opposite to the first lithographic affinity. For example, the substrate may be a metal sheet having a hydrophilic surface texture. By "collectively exhibit" is meant that even if one of the polymer binders does not independently exhibit the requisite lithographic affinity, it is sufficient if the final, solid blend of both polymers does exhibit that affinity. Furthermore, as used herein, the term "swellable" is intended to connote swelling and/or softening.

In various embodiments, the thermal coalescing temperature is at least 60° C., and may be at least 80° C. The particles and the polymer binder may comprise at least one of butyl (meth)acrylate, methyl(meth)acrylate, ethyl(meth)acrylate, styrene, (meth)acrylonitrile, N-phenyl maleimide, vinyl carbazole, or vinyl chloride. Preferred materials for the polymer binder include butyl(meth)acrylate, methyl(meth)acrylate and ethyl(meth)acrylate.

In another aspect, the invention relates to a method of forming an imageable lithographic printing member. Embodiments of the method involve applying, to a substrate, at least one imaging layer that itself comprises a first dispersion of first particles coalesceable into a first polymer binder at a first thermal coalescing temperature and a second dispersion of second particles coalesceable into a second polymer binder at a second thermal coalescing temperature. The second coalescing temperature is above room temperature and a drying temperature, and the first coalescing temperature is below both the second coalescing temperature and the drying temperature. The printing member includes (e.g., within the imaging layer) a material that absorbs imaging radiation and is heatable thereby to a temperature of at least the second coalescing temperature.

The imaging layer is dried at the drying temperature, causing the first particle dispersion to coalesce into the first polymer binder and the second particle dispersion, which has not coalesced, to be entrained therein. The first polymer binder is insoluble in but swellable by an aqueous liquid, and the second polymer binder is both insoluble in and not swellable by an aqueous liquid. The first and second polymer binders collectively exhibit a first lithographic affinity for ink or a liquid to which ink will not adhere, and the substrate exhibits a second lithographic affinity opposite to the first lithographic affinity.

In general, the first and second particle dispersions, as well as the absorptive material, are contained within a single imaging layer (applied as a coating in one or more layers). The final coating may have a dry coating weight of 0.5 to 2.5 $g/m^2$, which typically produces a coating thickness ranging from 0.4-0.5 to 2.2-2.5 μm. Typically, the drying temperature—which herein refers to the actual temperature of the plate, not the setting of the drying oven—is within the range spanning 60-100° C. In some embodiments, the second coalescing temperature is at least 60° C., e.g., at least 80° C. The first coalescing temperature may be within the range spanning 0° C. to 40° C.

As explained above, the first lithographic affinity may be oleophilicity and the second lithographic affinity hydrophilicity. For example, the substrate may be a metal sheet having a hydrophilic surface texture.

The particles may be present as a latex—i.e., a stable dispersion (emulsion) of polymer microparticles in an aqueous medium—in a coating composition. It is useful, in describing printing plates in accordance herewith, to define a "latex content" as consisting of the first and second particles. Accordingly, the first particles may represent at least 15% of the latex content, but may represent no more than 35% of the latex content. The first and second particles may comprise at least one of butyl(meth)acrylate, methyl(meth)acrylate, ethyl (meth)acrylate, styrene, (meth)acrylonitrile, N-phenyl maleimide, vinyl carbazole, or vinyl chloride. Preferred materials for the first particles include butyl(meth)acrylate, methyl (meth)acrylate and ethyl(meth)acrylate.

Particle size is not critical for the first particles. The second particles may have diameters ranging from a mean diameter of 175 nm to the thickness of the imaging layer. Synthetic considerations will generally determine the practical upper size limit of the second particles; for example, in many applications, it may be desirable to limit the mean particle diameter to a maximum of 800 nm.

In still another aspect, the invention relates to a method of imaging a lithographic printing member. Embodiments of the method involve providing a lithographic printing member comprising an imaging layer that itself comprises a first polymer binder and, dispersed therein, particles coalesceable into a second polymer binder at a thermal coalescing temperature substantially above room temperature; a material that absorbs imaging radiation and is heatable thereby to a temperature of at least the thermal coalescing temperature; and a substrate disposed below the at least one imaging layer. The first polymer binder is insoluble in but swellable by an aqueous liquid, the second polymer binder is insoluble in and not swellable by the aqueous liquid, and the first and second polymer binders collectively exhibit a first lithographic affinity for ink or a liquid to which ink will not adhere and the substrate exhibits a second lithographic affinity opposite to the first lithographic affinity. The printing member is exposed to imaging radiation in an imagewise pattern so as to heat the polymer particles to the thermal coalescing temperature to form the second polymer binder. After the second polymer binder has cooled to a solid form, the printing member is subjected to an aqueous liquid to remove unimaged portions of the imaging layer, thereby creating an imagewise lithographic pattern on the printing member.

The imaging radiation may be applied by at least one IR laser having abeam energy of, for example, at least 100 $mJ/cm^2$. In various embodiments, the aqueous liquid is mildly alkaline, i.e., has a pH of 7 or above, and indeed, the plate composition may be formulated such that the first polymer binder is not swellable by an aqueous liquid having a pH below 7, so that the plate resists action by fountain solutions with lower pH.

It should be stressed that, as used herein, the term "plate" or "member" refers to any type of printing member or surface capable of recording an image defined by regions exhibiting differential affinities for ink and/or fountain solution. Suitable configurations include the traditional planar or curved lithographic plates that are mounted on the plate cylinder of a printing press, but can also include seamless cylinders (e.g., the roll surface of a plate cylinder), an endless belt, or other arrangement. Furthermore, the term "hydrophilic" is used in the printing sense to connote a surface affinity for a fluid which prevents ink from adhering thereto. Such fluids include water for conventional ink systems, aqueous and non-aqueous dampening liquids, and the non-ink phase of single-fluid ink systems. Thus, a hydrophilic surface in accordance herewith exhibits preferential affinity for any of these materials relative to oil-based materials.

DESCRIPTION OF DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

1. Imaging Apparatus

Figure 2:
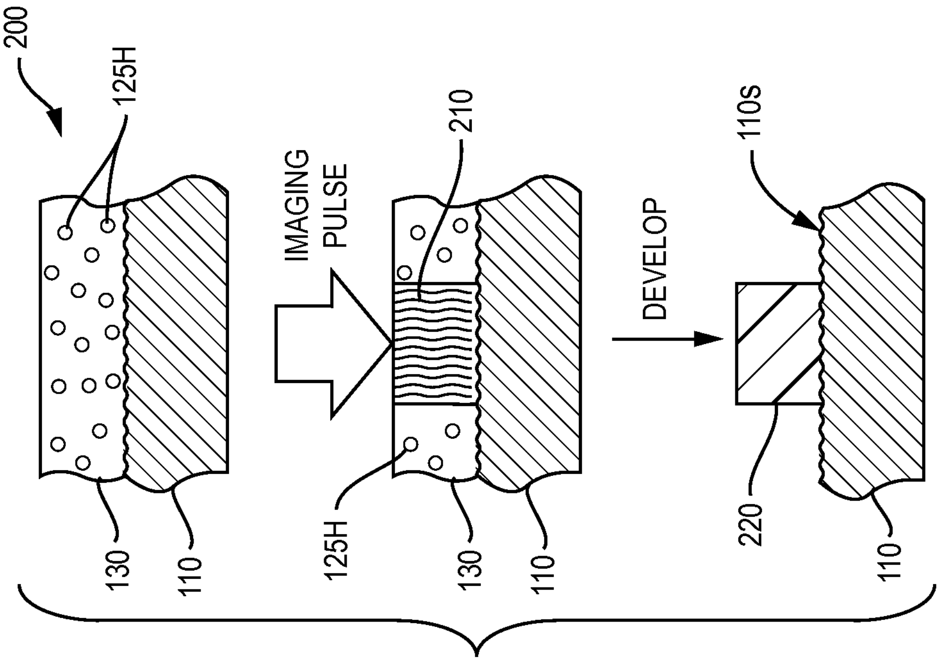
FIG. 2 illustrates imaging and developing a printing member produced as shown in FIG. 1.

An imaging apparatus suitable for use in conjunction with the present printing members includes at least one laser device that emits in the region of maximum plate responsiveness, i.e., whose $\lambda_{max}$ approximates the wavelength region where the plate absorbs most strongly. Specifications for lasers that emit in the near-IR region are fully described in U.S. Pat. No. Re. 35,512 ("the '512 patent") and U.S. Pat. No. 5,385,092 ("the '092 patent"), the entire disclosures of which are hereby incorporated by reference. Lasers emitting in other regions of the electromagnetic spectrum are well-known to those skilled in the art.

Suitable imaging configurations are also set forth in detail in the '512 and '092 patents. Briefly, laser output can be provided directly to the plate surface via lenses or other beam-guiding components, or transmitted to the surface of a blank printing plate from a remotely sited laser using a fiber-optic cable. A controller and associated positioning hardware maintain the beam output at a precise orientation with respect to the plate surface, scan the output over the surface, and activate the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor ("RIP") or other suitable means. For example, a RIP can accept input data in page-description language, which defines all of the features required to be transferred onto the printing plate, or as a combination of page-description language and one or more image data files. The bitmaps are constructed to define the hue of the color as well as screen frequencies and angles.

Other imaging systems, such as those involving light valving and similar arrangements, can also be employed; see, e.g., U.S. Pat. Nos. 4,577,932; 5,517,359; 5,802,034; and 5,861,992, the entire disclosures of which are hereby incorporated by reference. Moreover, it should also be noted that image spots may be applied in an adjacent or in an overlapping fashion.

The imaging apparatus can operate on its own, functioning solely as a platemaker, or can be incorporated directly into a lithographic printing press. In the latter case, printing may commence immediately after application of the image to a blank plate, thereby reducing press set-up time considerably. But in general, the printing plates of the present invention are most easily prepared on a platemaker in order to facilitate application of sufficient developing liquid and/or mechanical action to complete the imaging process.

The imaging apparatus can be configured as a flatbed recorder or as a drum recorder, with the lithographic plate blank mounted to the interior or exterior cylindrical surface of the drum. In this configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam. Examples of useful imaging devices include models of the TRENDSETTER imagesetters (available from Eastman Kodak Company) that utilize laser diodes emitting near-IR radiation at a wavelength of about 830 nm. Other suitable exposure units include the CRESCENT 42T Platesetter (operating at a wavelength of 1064 nm, available from Gerber Scientific, Chicago, Ill.) and the SCREEN PLATERITE 4300 series or 8600 series plate-setter (available from Screen, Chicago, Ill.).

Regardless of the manner in which the beam is scanned, in an array-type system for on-press applications it is generally preferable to employ a plurality of lasers and guide their outputs to a single writing array. The writing array is then indexed, after completion of each pass across or along the plate, a distance determined by the number of beams emanating from the array, and by the desired resolution (i.e., the number of image points per unit length). Off-press applications, which can be designed to accommodate very rapid scanning (e.g., through use of high-speed motors, mirrors, etc.) and thereby utilize high laser pulse rates, can frequently utilize a single laser as an imaging source.

2. Lithographic Printing Members and Their Production

Printing members in accordance with the invention exhibit advantages, including, in various embodiments:

- Imageability by lasers of typical and frequently used wavelengths (e.g., 830 nm) through use of suitable near-IR absorbers, such as pigments and/or dyes.
- Non-ablative imaging.
- Imaging at reasonable laser energies (e.g., 100-300 mJ/c$^2$), which translate into commercially adequate imaging speeds.
- Imaging to high resolution.
- Stability under room light and resistance to handling damage, including fingerprints.
- Processing under gentle conditions, including low pH.
- Potential for using a development gum as a wipe-on, leave-on preservative for the exposed hydrophilic surface.
- Ability to be processed on a simple one-station, one-fluid processor. If a separate gumming station is used, that station might be able to use the same processing fluid as the development station.

Figure 1:
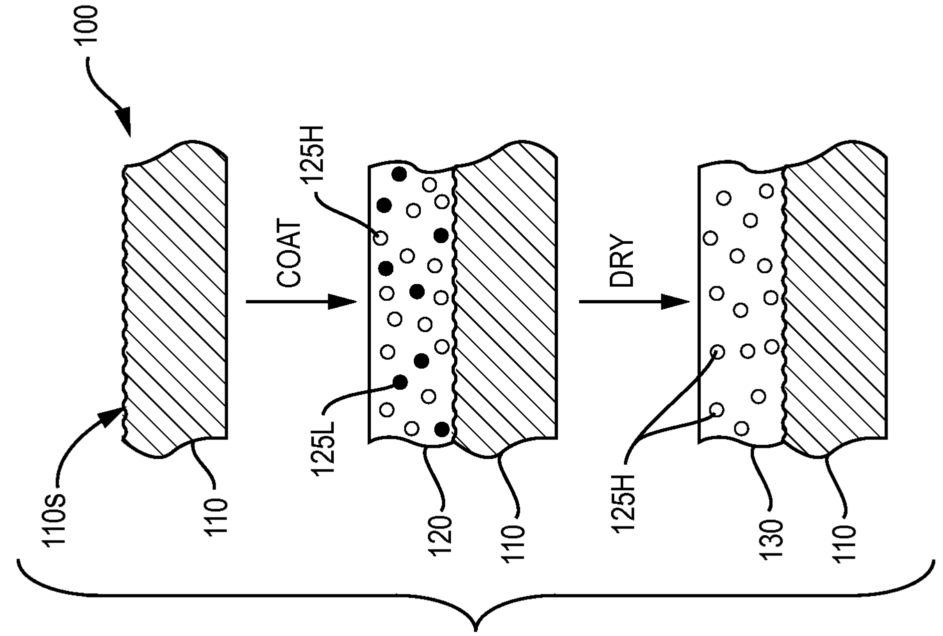
FIG. 1 conceptually illustrates a process flow for producing a printing member according to the invention.

FIG. 1 illustrates a process sequence 100 for forming a lithographic printing member in accordance herewith. A substrate 110, which may be a metal sheet with a hydrophilic surface (as described in greater detail below), is coated with a layer 120. Layer 120 may be a single layer or multiple adjacent layers of identical or similar composition, and is continuous, meaning that the underlying surface is completely covered with a uniform layer of the deposited material.

Layer 120 includes a material, such as a pigment and/or a dye, that absorbs imaging (e.g., near-IR) radiation and converts it to heat. Layer 120 also contains two particle dispersions 125L, 125H. The particles and the absorber are dispersed within a carrier, such as water. Particles 125L are coalesceable into a polymer binder at a "low" thermal coalescing temperature and particles 125H are coalesceable into a polymer binder at a "high" thermal coalescing temperature. The high coalescing temperature is above room temperature and also above the temperature at which the layer 120 is dried; for example, the high coalescing temperature may be at least 60° C., and in some embodiments, at least 80° C. The low coalescing temperature is below both the high coalescing temperature and the drying temperature, e.g., 0° C. to 40° C.

The coated substrate is dried at the drying temperature—generally 60-100° C.—which causes the particle dispersion 125L (but not the particle dispersion 125H) to coalesce into a polymer binder 130, entraining the particle dispersion 125H. The polymer binder 130 is insoluble in but swellable by aqueous liquids.

The various components just discussed will now be described in greater detail.

2.1 Substrate 110

The substrate provides dimensionally stable mechanical support to the printing member. The substrate should be strong, stable, and flexible. One or more surfaces of the substrate 110, including top surface 110*s*, is hydrophilic, and the substrate 110 itself is desirably metal.

In general, metal layers undergo special treatment in order to be capable of accepting fountain solution in a printing environment. Any number of chemical or electrical techniques, in some cases assisted by the use of fine abrasives to roughen the surface, may be employed for this purpose. For example, electrograining involves immersion of two opposed aluminum plates (or one plate and a suitable counterelectrode) in an electrolytic cell and passing alternating current between them. The result of this process is a finely pitted surface topography that readily adsorbs water. See, e.g., U.S. Pat. No. 4,087,341.

A structured or grained surface can also be produced by controlled oxidation, a process commonly called "anodizing." An anodized aluminum substrate consists of an unmodified base layer and a porous, "anodic" aluminum oxide coating thereover; this coating readily accepts water. However, without further treatment, the oxide coating would lose wettability due to further chemical reaction. Anodized plates are, therefore, typically exposed to a silicate solution or other suitable (e.g., phosphate) reagent that stabilizes the hydrophilic character of the plate surface. In the case of silicate treatment, the surface may assume the properties of a molecular sieve with a high affinity for molecules of a definite size and shape—including, most importantly, water molecules. The treated surface also promotes adhesion to an overlying photopolymer layer. Anodizing and silicate treatment processes are described in U.S. Pat. Nos. 3,181,461 and 3,902,976.

Preferred hydrophilic substrate materials include aluminum that has been mechanically, chemically, and/or electrically grained with subsequent anodization. The resulting oxide layer provides both abrasion resistance and water wettability. However, an additional post-anodic treatment (PAT) can provide enhanced hydrophilicity and ease of processing for the imaging layer. There are several different post-anodic treatments that will produce a sufficiently hydrophilic surface, including sodium silicate, phosphate-fluoride, and poly (vinyl phosphonic acid). A preferred PAT is immersion of the anodized plate into a warm dilute bath of poly(vinyl phosphonic acid), or a copolymer of vinyl phosphonic acid, followed by rinsing to remove excess reagent and leave a very thin surface treatment. A representative PAT is performed by dipping the anodized aluminum substrate into a 1-2% solution of poly(vinyl phosphonic) acid or a copolymer of vinyl phosphonic acid for 30 to 60 seconds, rinsing the treated plate with deionized water, removing excess water with a rubber squeegee, and drying the resulting plate for at least 43 seconds at 250° F.

2.2 Layer 120/130

The particles 125H, 125L may be present as a latex in a coating composition that utilizes, e.g., water as a carrier. The coating 120 may optionally contain other components for ease of use or appearance. A coloring agent, such as a dye or pigment dispersion, may be included to provide better visual contrast for inspection of the plate after imaging and processing. The colorant should be no more than 10% by weight of the imaging layer composition, preferably 1 to 3% by weight. The imaging layer composition may also contain a surfactant for leveling and wetting; the surfactant is generally present at less than 5% by weight of the imaging layer composition, and preferably at a level of about 1% by weight. Any of numerous surfactants may be used, the only significant requirement being solubility in the coating solvent (typically water). For example, non-ionic surfactants such as TRITON X-100 from Dow or ZONYL FSN-100 from DuPont, or the anionic surfactant LODYNE 103A from Ciba, may be employed. Finally, an optional water-soluble overcoat may also be provided to protect the plate from the environment, and for additional handling stability and scuff resistance.

The printing plate 100 may optionally contain an underlayer (not shown) between the substrate 110 and the imaging layer 120. The underlayer contains a polymer that is removable by the aqueous developing fluid discussed below. The underlayer is preferably a polymer with acid groups that can be ionized under mildly alkaline conditions. The underlayer serves the dual purposes of promoting adhesion of the coalesced layer 130 to the substrate 110, and also protecting the substrate 110. In some cases, the underlayer improves the mechanical properties of the layer 120 coated over it. A representative material for the underlayer is styrene-maleic anhydride copolymer (e.g., SCRIPSET 540 from Hercules) applied at a dry coating weight of 50-250 mg/m$^2$, e.g., at 100 mg/m$^2$.

Layer 120 may be applied using a wire-wound rod or other coating technique as are well-known in the art, such as reverse roll coating, gravure coating, or slot die coating. Layer 120 is typically applied between 0.75 and 1.5 g/m$^2$. In one embodiment, layer 120 is applied at a dry coating weight of about 1 g/m$^2$.

2.2.1 Particles 125H, 125L

The relative proportions of particles—i.e., their relative contributions to the latex content of the coating composition—depends on the application. In general, the particles 125L may represent at least 15% of the latex content; less than this proportion may not produce adequate mechanical properties for plate handling. At the same time, the proportion of particles 125L should be low enough to allow the plate to be developed without leaving an undesirable deposit of ink-receiving material in the background; this may limit the percentage of particles 125L, in typical embodiments, to no more than 35% of the latex content. The particles 125H, 125L may be formulated utilizing similar or even identical components, or selected from the same general group of materials, which are optimized (through routine formulation adjustments) for the appropriate coalescence temperature.

Accordingly, particles 125H, 125L may comprise or consist essentially of styrene derivatives, methacrylates, acrylates, methacrylamides, acrylamides, maleimides, vinyl ethers, vinyl esters. More specifically, the monomers used in the emulsion polymerization may be any of styrene, para-methylstyrene, tert-butylstyrene, methylmethacrylate, ethylmethacrylate, butylmethacrylate, glycidylmethacrylate, hydroxyethylmethacrylate, a-methylstyrene, ethylacrylate, butylacrylate, vinylacetate, vinyl versatate, butadiene, isoprene, acrylonitrile, methacrylonitrile, sulfoethyl methacrylate and its alkali salts, acrylic acid, methacrylic acid, tert-butyl acrylamide, acrylamido-methyl-propane sulfonate polymer (AMPS), N-isopropylacrylamide, itaconic acid, maleic acid, maleic anhydride, vinylidene chloride, isopropylmethacrylate, dialkyl itaconate, acrylonitrile, methacrylonitrile and/or vinyl chloride. Preferred materials include one or more of butyl(meth)acrylate, methyl(meth)acrylate, ethyl(meth)acrylate, styrene, (meth)acrylonitrile, N-phenyl maleimide, vinyl carbazole, or vinyl chloride, with butyl (meth)acrylate, methyl(meth)acrylate and ethyl(meth)acrylate being particularly preferred for particles 125L.

Particle size is not critical for particles 125L. Particles 125H may have diameters ranging from a mean diameter of 175 nm to the thickness of the imaging layer. Synthetic considerations will generally determine the practical upper size limit of particles 125H; for example, in many applications, it may be desirable to limit the mean particle diameter to a maximum of 800 nm.

The polymer of the particle should be oleophilic or wettable by ink vehicles (although, as noted below, it is the lithographic affinity of the combined polymer binders that is critical). The polymer of the particles 125H also should not be easily softened or swelled by water, since this brings about two undesirable effects: first, the overall mechanical strength of the imaged coating will be compromised in a printing press, where the plate is constantly exposed to water; and second, ingress of water may lower the coalescing temperature of the particles by hydroplasticization, which limits the process window for applying the coating. Suitable materials for particles 125H preferably are not easily plasticized by water (examples include styrene or butyl acrylate), so that the $T_g$ of the particles is not accidentally depressed below the drying temperature; but other monomers, such as methyl methacrylate, acrylonitrile, and other monomeric species, can be used as long as their degree of hydroplasticization is taken into account. The $T_g$ of particles 125H, including plasticization by water, is preferably higher than 80° C. for convenient drying rates and storage stability, and can be higher; however, in practical terms, the highest $T_g$ achievable for most polymers useful herein is about 100-120° C.

The $T_g$ of particles 125L can be any temperature below the $T_g$ of particles 125H, but is preferably much lower for easier coalescence at the drying stage, and most preferably at least 20° C. below the drying temperature of the coating. A practical range of $T_g$ values for particles 125H is 0° C.≤$T_g$≤40° C.: below this range the plate has insufficient shelf life for storage, while above this range there may be insufficient film formation and adhesion to the substrate 110 in the coating and drying step.

The particles 125H, 125L can be obtained commercially or synthesized in accordance with procedures well known in the art; see, e.g., EP Patent No. 773113 (paragraphs 0029 thru 0033); U.S. Pat. No. 7,195,861 (column 3, line 50 through column 4, line 21); U.S. Pat. No. 6,805,052 (column 23 and column 25, and Example 2); U.S. Patent Publ. No. 2009/0155722 (paragraphs 0074 through 0076); and EP Patent No. 1217010 (page 16, table 4 and page 17, table 7). The contents of these publications are hereby incorporated by reference in their entireties.

2.2.2 Absorptive Material

Layer 120 includes a material that absorbs imaging radiation, which heats the layer above the coalescence temperature of particles 125H. For IR or near-IR imaging radiation, suitable absorbers include a wide range of dyes and pigments, such as carbon black, nigrosine-based dyes, phthalocyanines (e.g., aluminum phthalocyanine chloride, titanium oxide phthalocyanine, vanadium (IV) oxide phthalocyanine, and the soluble phthalocyanines supplied by Aldrich Chemical Co., Milwaukee, Wis.); naphthalocyanines (see, e.g., U.S. Pat. Nos. 4,977,068; 4,997,744; 5,023,167; 5,047,312; 5,087,390; 5,064,951; 5,053,323; 4,723,525; 4,622,179; 4,492,750; and 4,622,179); iron chelates (see, e.g., U.S. Pat. Nos. 4,912,083; 4,892,584; and 5,036,040); nickel chelates (see, e.g., U.S. Pat. Nos. 5,024,923; 4,921,317; and 4,913,846); oxoindolizines (see, e.g., U.S. Pat. No. 4,446,223); iminium salts (see, e.g., U.S. Pat. No. 5,108,873); and indophenols (see, e.g., U.S. Pat. No. 4,923,638). Any of these materials may be dispersed the composition deposited as layer 120. In the case of a pigment, typical loading levels may range from 30-40% of the dry coating weight.

The absorptive material should minimally affect adhesion between layer 120 and substrate 110. Surface-modified carbon-black pigments sold under the trade designation CAB-O-JET 200 by Cabot Corporation, Bedford, Mass. are found to minimally disrupt adhesion at loading levels providing adequate sensitivity for heating. The CAB-O-JET series of carbon black products are unique aqueous pigment dispersions made with novel surface modification technology, as, for example, described in U.S. Pat. Nos. 5,554,739 and 5,713,988.

The absorbing agent should be at least compatible with the particle dispersions, and not cause them to destabilize or flocculate, and should combine with them to form an integral layer upon drying—i.e., the dye and/or pigment should remain dispersed and combined with the other components and not segregate itself into a separate phase. Water-soluble IR-absorptive dyes have been employed to advantage, with dyes that absorb in the neighborhood of 830 nm being the most practical. Typically, the light absorbing agent is 0.5 to 20% of the coating by weight. Preferably, it is 12% or less by weight.

3. Imaging Techniques

FIG. 2 shows a representative sequence of imaging and development for the plate shown in FIG. 1, herein indicated at 200. In the exposed region 210, the imaging pulse is absorbed and converted to heat. The heat raises the temperature of the particles 125H above their coalescence temperature, melting them along with the binder 130. Following dissipation of the heat, the merged material in the exposed region 210 coalesces into a substantially homogeneous, polymeric feature 220, which is insoluble in and non-swellable by aqueous liquids. Imaging takes place substantially without ablation of material.

To develop the plate 200, it is subjected to an aqueous processing fluid (e.g., water or a dampening solution) to swell unexposed portions of layer 120. This swelling action de-anchors from substrate 110 portions of the binder 130 that have not been exposed, facilitating its removal by mechanical action (e.g., rubbing). The hardened image features 220, being impervious to swelling by the aqueous liquid, remain anchored to the substrate 110.

Preferred processing solutions contain an anionic surfactant, preferably an aryl sulfonate salt or an alkyl sulfate salt, and either an aqueous base or pH buffer to adjust the pH to neutral or slightly basic—preferably a pH greater than or equal to 7, e.g., 9 or above. The surfactant is preferably present at a level of 1% to 10% by weight (and preferably 2.5% to 5% by weight) of the total processing fluid, and the pH adjusting agent can be present at 2% or less by weight (and preferably 1% by weight or less) of the total processing fluid. The processing fluid may optionally contain a hydrophilic binder, generally at 5% or less by weight (and preferably at 2.5% or less by weight). If a hydrophilic binder is present, the plate may be buffed dry without a rinse and gum step, and the processing fluid itself may function as a protective layer for the exposed hydrophilic substrate prior to mounting the plate on a printing press.

Printing with the printing member includes applying dampening solution to the plate followed by ink, which is thereby transferred in the imagewise lithographic pattern (created as described above) to a recording medium such as paper. The inking and transferring steps may be repeated a desired number of times, e.g., up to 100,000 or more times.

EXAMPLES

Substrate Preparation

An Al sheet, having a thickness of 0.008" with one side electrochemically grained and anodized, was cut into 10.5"× 16.25" sheets. A surface-treatment bath was prepared by diluting 0.567 kg of PVPS-30 (a 30% water solution of poly (vinyl phosphonic acid) ("PVPA") from AZ Electronic Materials) to 17 kg total solution weight and stirring for 2 hours. The treatment bath was warmed to a constant temperature of 60° C. The sample was immersed in the treatment bath for 30 seconds, followed immediately by a rinse with a deionized water spray for at least 10 seconds. The excess water was driven off with a rubber squeegee, followed by drying in a forced air oven at 250° F. for at least 43 seconds, followed by a 15 second cool-down stage. The bottom half of each plate received a surface treatment, while the top half was left untreated.

In another set of tests, the 0.008"-thick Al Sheet was electrochemically grained and anodized, and then treated with a sodium silicate solution to produce an anodic layer with a silicate surface treatment.

Coating Raw Materials

The following materials were used in the coating formulations described below.

RCS1-33: a poly(styrene-co-butyl acrylate) latex, 223 nm particle diameter, 37.6% solids, $T_g$=85° C. (dry and wet nearly equal).

KW1-56: a poly(butyl methacrylate-co-butyl acrylate-co-acrylic acid) latex, 120 nm particle diameter, 21.11% solids, $T_g$=14° C. (dry), 5° C. (wet).

KW1-57: a poly(butyl methacrylate-co-acrylic acid) latex, 120 nm particle diameter, 19.15% solids, Tg=35° C. (dry), 25.4° C. (wet).

Triton X-100: surfactant, coating and leveling aid.

IR 822 Na Salt: water-soluble infrared dye from Hampford Industries

Malachite Green Hydrochloride Carbinol Base: visible dye, chloride salt, obtained from Sigma Aldrich Chemical and used as received.

Coating Formulations

Two coatings with an IR-absorbing dye were prepared for application to PVPA-treated Al:

| Reagent | Function | Solids | Coating 1 | Coating 2 |
|---|---|---|---|---|
| RCS1-33 | styrene-butyl acrylate | 37.6 | 9.19 | 8.99 |
| KW1-57 | butyl methacrylate + butyl acrylate + acrylic acid | 19.15 | 4.51 | 4.41 |
| Malachite Green | visible dye | 5 | 0.00 | 1.92 |
| IR 822 Na Salt | IR dye | 100 | 0.48 | 0.48 |
| Triton X-100 | | 10 | 0.40 | 0.40 |
| water | | | 35.42 | 33.80 |

Each formulation is made to 12% total solids: the colorant dye, when present, is 2% by weight of the dry film solids, and the absorbing dye is 10% by weight of the total dry film solids.

The mixture is made in two preliminary steps, then blended together for a final coating formulation. The first mixture (Mix A) is formed by adding all latex components to water to make 25 g total, mixing for 1 minute, adding 2 drops of 6% $NH_4OH$ solution to neutralize pH to about 7, and then mixing for 15 minutes. The second mixture (Mix B) is formed by combining all other components and diluting with water to 25 g. Mix B is then stirred for 1 minute and neutralized with 2 drops of 6% $NH_4OH$ as for Mix A. When Malachite Green is used as the colorant, however, it is added last, after neutralization by $NH_4OH$. The mixture is then allowed to stir for 15 minutes.

To form the final coating formulation, Mix B is added to Mix A while stirring Mix A, and the blend is stirred for at least 15 minutes. In practice, the pH is observed to increase dramatically, and is adjusted back toward 6 to 7 with $NH_4OH$ as before to accommodate the solubility of the dye. The final coating mixture is stable for at least 2-3 days. Coatings were made on PVPA treated Al.

Two coatings with an IR-absorbing pigment dispersion were prepared for application to PVPA-treated Al:

| Reagent | Function | Solids | Coating 3 | Coating 4 |
|---|---|---|---|---|
| RCS1-33 | styrene-butyl acrylate | 37.6 | 8.89 | 8.89 |
| KW1-57 | butyl methacrylate + butyl acrylate + acrylic acid | 19.15 | 4.36 | 4.36 |
| Cab-o-Jet 250C | Cyan dispn. | 9.97 | 1.30 | 0.00 |
| Cab-o-Jet 554C | Cyan dispn. | 10.07 | 0.00 | 1.29 |
| Colorant Dye | visible dye | 5 | 0.00 | 0.00 |
| IR 822 Na Salt | IR dye | 100 | 0.48 | 0.48 |
| Triton X-100 | | 10 | 0.40 | 0.40 |
| water | | | 34.57 | 34.59 |

These coatings were formulated as described above with one exception: the cyan pigment dispersions, being stable in the presence of the latexes, were made part of Mix A instead of Mix B. Otherwise, the same mix procedure was followed. Coatings were made on PVPA-treated Al.

Four coatings with an IR-absorbing dye were prepared for application to silicate-treated Al:

| Reagent | Function | Solids | Coating 5 | Coating 6 (Malachite Green) | Coating 7 (Ethyl Violet) | Coating 8 (Trypan Blue) |
|---|---|---|---|---|---|---|
| RCS1-33 | styrene-butyl acrylate | 37.6 | 9.19 | 8.99 | 8.99 | 8.99 |
| KW1-56 | butyl methacrylate + butyl acrylate + acrylic acid | 21.11 | 4.51 | 4.41 | 4.41 | 4.41 |

-continued

| Reagent | Function | Solids | Coating 5 | Coating 6 (Malachite Green) | Coating 7 (Ethyl Violet) | Coating 8 (Trypan Blue) |
|---|---|---|---|---|---|---|
| Malachite Green | visible dye | 5 | 0.00 | 1.92 | | |
| Ethyl violet | visible dye | 5 | | | 1.92 | |
| Trypan blue | visible dye | 5 | | | | 1.92 |
| IR 822 Na Salt | IR dye | 100 | 0.48 | 0.48 | 0.48 | 0.48 |
| Triton X-100 | | 10 | 0.40 | 0.40 | 0.40 | 0.40 |
| water | | | 35.42 | 33.80 | 33.80 | 33.80 |

The formulation procedure used for these coatings was identical to that employed for Coatings 1-4. These coatings were applied to silicate-treated Al.

Coating Technique

Substrates prepared as described above were coated with one of the above formulations using a wire-wound #4 coating rod, and dried in a Wisconsin conveyor belt plate oven at 160° F. and a belt speed of 3.16 ft/minute. This results in a drying time of 43 seconds at elevated temperature plus a 13-second dwell in the cooling zone. The coating conditions were targeted at producing a dry coating weight of 1.1 g/m$^2$, which typically produces a coating thickness of 1 μm.

Imaging and Development Tests

Plates were imaged on a Kodak Trendsetter with the drum speed set at 120 rpm and variable power settings to expose the plate between 100 and 300 mJ/cm$^2$ in regular power steps. The plates were developed with the following developer:

Part A: 10% solution of an alkylnaphthalene sulfonate sodium salt.

Part B: a pH 7.5 buffer composed of 0.18M sodium dibasic phosphate and 0.011M citric acid Final developer: equal parts by weight of A and B.

The developer was wiped on with a nonwoven cotton wipe, allowed to stand for 10 seconds, wiped again over the entire plate, rinsed with deionized water, and allowed to air dry to touch.

Printing Tests

The resulting plates were mounted on a Heidelberg GTO press and printed on uncoated stock, using a process black ink, Crystal 2500 fountain solution with Jetwet alcohol sub, and a compressible blanket. Each plate was run for a total of 200 impressions. The results for plates on PVPA-treated Al were as follows:

Coating 1: Image retained above 275 mJ/cm$^2$ with damage, clean background from start. Print quality was the same for 200 impressions.

Coating 2: Imaged from 250 mJ/cm$^2$ up. Clean background at start. Image quality maintained for 200 impressions.

Coating 3: Plate imaged at 275 mJ/cm$^2$ and higher, clean background. Image quality maintained for 200 impressions.

Coating 4: Plate imaged at 250 mJ/cm$^2$ and higher, clean background except at left hand edge. Image quality maintained for 200 impressions.

The results for plates on silicate-treated Al were as follows:

Coatings 5 and 6: Plates initially rolled up with ink take, but cleaned out by 500 impressions. The plates continued to print for 2000 impressions.

Coating 7: The plate initially rolled up with ink take, but cleaned out by 300 impressions. The plate continued to print for 1500 impressions.

Coating 8: The plate initially rolled up with ink take, but cleaned out by 300 impressions. The plate continued to print for 1000 impressions.

Although the present invention has been described with reference to specific details, it is not intended that such details should be regarded as limitations upon the scope of the invention, except as and to the extent that they are included in the accompanying claims.

What is claimed is:

1. A method of imaging a lithographic printing member, the method comprising the steps of:

(a) providing a lithographic printing member comprising (i) an imaging layer that itself comprises a first polymer binder and, dispersed therein, particles coalesceable into a second polymer binder at a thermal coalescing temperature substantially above room temperature, (ii) a material that absorbs imaging radiation and is heatable thereby to a temperature of at least the thermal coalescing temperature, and (iii) a substrate disposed below the imaging layer, wherein: (1) the first polymer binder is insoluble in but swellable by an aqueous liquid and comprises at least one of butyl methacrylate or butyl acrylate; (2) the second polymer binder is insoluble in and not swellable by the aqueous liquid and comprises at least one of styrene and butyl acrylate; (3) the first and second polymer binders collectively exhibit a first lithographic affinity for ink or a liquid to which ink will not adhere and the substrate exhibits a second lithographic affinity opposite to the first lithographic affinity; and (4) the particles comprise at least one of butyl(meth)acrylate, methyl(meth)acrylate, ethyl(meth)acrylate, styrene, (meth)acrylonitrile, N-phenyl maleimide, vinyl carbazole, or vinyl chloride, (b) exposing the printing member to imaging radiation in an imagewise pattern so as to heat the polymer particles to the thermal coalescing temperature to form the second polymer binder; and (c) after the second polymer binder has cooled to a solid form, subjecting the printing member to an aqueous liquid to remove unimaged portions of the imaging layer, thereby creating an imagewise lithographic pattern on the printing member.

2. The method of claim 1 wherein the material that absorbs imaging radiation is contained within the imaging layer.

3. The method of claim 2 wherein the imaging radiation is applied by at least one IR laser having a beam energy of at least 100 mJ/cm$^2$.

4. The method of claim 1 wherein the aqueous liquid has a pH of at least 7.

5. The method of claim 4 wherein the second polymer binder is not swellable by an aqueous liquid having a pH below 7.

6. The method of claim 1 wherein the material that absorbs imaging radiation comprises a pigment.

7. The method of claim 1 wherein the material that absorbs imaging radiation comprises a dye.

8. The method of claim 1 wherein the thermal coalescing temperature is at least 60° C.

9. The method of claim 8 wherein the thermal coalescing temperature is at least 80° C.

10. The method of claim 1 wherein the first lithographic affinity is oleophilicity and the second lithographic affinity is hydrophilicity.

11. The method of claim 10 wherein the substrate is a metal sheet having a hydrophilic surface texture.

12. The method of claim 1 wherein the imaging layer has a latex content consisting of the first polymer binder and the particles, the first polymer binder representing at least 15% of the latex content.

13. The method of claim 12 wherein the first polymer binder represents no more than 35% of the latex content.

14. The method of claim 1 wherein the particles have a mean diameter of at least 175 nm.

15. The method of claim 14 wherein the particles have a mean diameter no greater than 800 nm.

16. A method of imaging a lithographic printing member, the method comprising the steps of:

(a) providing a lithographic printing member comprising (i) an imaging layer that itself comprises a first polymer binder and, dispersed therein, particles coalesceable into a second polymer binder at a thermal coalescing temperature substantially above room temperature, (ii) a material that absorbs imaging radiation and is heatable thereby to a temperature of at least the thermal coalescing temperature, and (iii) a substrate disposed below the imaging layer, wherein: (1) the first polymer binder is insoluble in but swellable by an aqueous liquid and consists essentially of butyl methacrylate, butyl acrylate and acrylic acid; (2) the second polymer binder is insoluble in and not swellable by the aqueous liquid and comprises at least one of styrene and butyl acrylate; and (3) the first and second polymer binders collectively exhibit a first lithographic affinity for ink or a liquid to which ink will not adhere and the substrate exhibits a second lithographic affinity opposite to the first lithographic affinity, (b) exposing the printing member to imaging radiation in an imagewise pattern so as to heat the polymer particles to the thermal coalescing temperature to form the second polymer binder; and (c) after the second polymer binder has cooled to a solid form, subjecting the printing member to an aqueous liquid to remove unimaged portions of the imaging layer, thereby creating an imagewise lithographic pattern on the printing member.

17. The method of claim 16 wherein the material that absorbs imaging radiation is contained within the imaging layer.

18. The method of claim 16 wherein the first lithographic affinity is oleophilicity and the second lithographic affinity is hydrophilicity.

* * * * *